United States Patent [19]

Elias et al.

[11] Patent Number: 4,873,118
[45] Date of Patent: Oct. 10, 1989

[54] OXYGEN GLOW TREATING OF ZNO ELECTRODE FOR THIN FILM SILICON SOLAR CELL

[75] Inventors: Eric Elias, Los Angeles; Karl E. Knapp, Tarzana, both of Calif.

[73] Assignee: Atlantic Richfield Company, Los Angeles, Calif.

[21] Appl. No.: 273,453

[22] Filed: Nov. 18, 1988

[51] Int. Cl.$^4$ ............................................... B05D 3/06
[52] U.S. Cl. ........................................ 427/39; 156/634; 704/192.35; 427/331
[58] Field of Search ................ 156/634; 427/39, 331; 204/192.35

[56] References Cited

U.S. PATENT DOCUMENTS

| | | | |
|---|---|---|---|
| 2,841,477 | 7/1958 | Hull | 156/643 |
| 4,634,600 | 1/1987 | Shimizu et al. | 427/39 |
| 4,678,539 | 7/1987 | Tomita et al. | 427/38 |
| 4,715,941 | 12/1987 | Jones et al. | 427/39 |
| 4,790,883 | 12/1988 | Sichanugrist et al. | 427/39 |
| 4,792,670 | 12/1988 | Fukada et al. | 427/39 |

Primary Examiner—Stanley Silverman
Attorney, Agent, or Firm—Nilsson, Robbins, Dalgarn, Berliner, Carson & Wurst

[57] ABSTRACT

An improved method for making solar cells of the type wherein a thin film silicon hydrogen alloy structure is deposited upon a transparent zinc oxide conductive film. Before deposition of the TFS film, the zinc oxide film is treated with a glow discharge comprising oxygen.

13 Claims, 1 Drawing Sheet

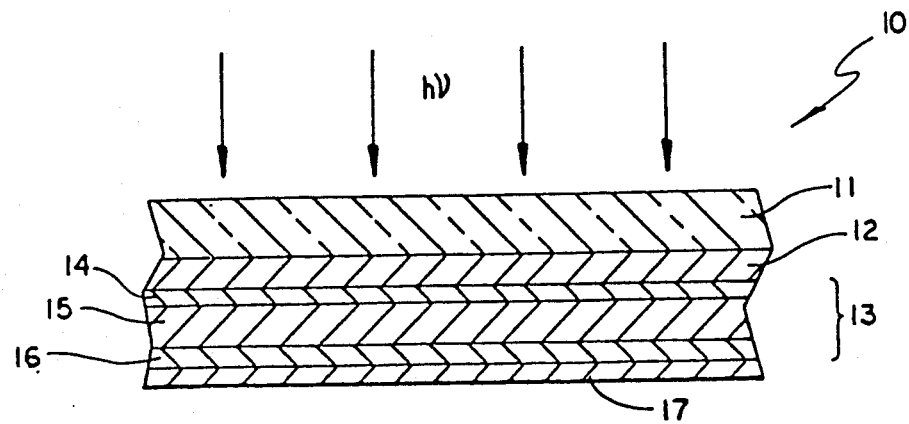

OXYGEN GLOW TREATING OF ZNO ELECTRODE FOR THIN FILM SILICON SOLAR CELL

BACKGROUND OF THE INVENTION

The present invention relates generally to the art of photoconductive devices and, more particularly, to a method of oxygen glow treatment of a zinc oxide transparent conductor prior to deposition of a thin film silicon hydrogen alloy film onto said conductor layer.

Photoconductive devices generally consist of a photoconductor capable of generating electrical potential upon being exposed to light and contacts which are effective to draw off any electrical current which results from irradiation of the photoconductor. Such devices include photovoltaic devices, more commonly referred to as solar cells, in which the active structure is formed from thin film silicon hydrogen alloy material formed by a glow discharge in silane. U.S. Pat. No. 4,623,601, issued to Lewis, et al on Nov. 18, 1986, discloses several forms of such devices and is hereby incorporated for all purposes. The preferred structure disclosed by Lewis, et al includes a glass substrate, a zinc oxide transparent conductor, a PIN thin film silicon, TFS, photovoltaic structure and a back contact also formed of zinc oxide.

U.S. Pat. No. 4,751,149 issued to Vijayakumar, et al on June 14, 1988, is also incorporated by reference for all purposes. The Vijayakumar, et al patent discloses a preferred method for depositing highly conductive transparent zinc oxide films at a low deposition temperature.

As illustrated by the above referenced patents, considerable work has been done in efforts to improve the performance of TFS type solar cells. In general, this is based on the belief that the manufacturing costs of thin film type structures should ultimately be lower than the classical single crystal type of solar cells. However, the performance of thin film type solar cells, generally measured in terms of efficiency of conversion of sunlight to electricity, is less than that of the single crystal cells. Most research and development work in the thin film type area has therefore been directed toward improvement of cell efficiency.

SUMMARY OF THE INVENTION

An object of the present invention is to provide an improved method for manufacturing thin film silicon hydrogen alloy photoconductive devices with improved photovoltaic conversion efficiency.

The present invention comprises an improved process of manufacturing solar cells of the type wherein a zinc oxide conductive layer is deposited upon a substrate to form one contact of a photoconductive device and one or more layers of thin film silicon hydrogen alloy is deposited upon the zinc oxide film to form an active photoconductive structure. The improvement comprises treating of the zinc oxide film with a glow discharge containing oxygen prior to deposition of the first thin film silicon hydrogen alloy layer onto the zinc oxide film.

BRIEF DESCRIPTION OF THE DRAWINGS

The single FIG. is a cross sectional view of a photoconductive device which may be manufactured with improved performance by use of the method of the present invention.

DESCRIPTION OF THE PREFERRED EMBODIMENTS

With reference to FIG. 1, there is illustrated a photovoltaic cell structure of the type whose performance is improved by use of the method of the present invention. The structure illustrated in FIG. 1 is the same as that illustrated in FIG. 1 of the above referenced U.S. Pat. No. 4,623,601. The device 10 of FIG. 1 includes a substrate 11 such as glass, a transparent conductive layer 12 comprising zinc oxide and a composite TFS layer 13. The layer 13 includes a P-layer 14, an I-layer 15 and an N-layer 16. Adjacent layer 16 is a second electrically conductive layer 17, which in the preferred embodiment is also a transparent conductive layer of zinc oxide.

As illustrated in the FIG. light enters the photovoltaic structure 13 through the substrate 11 and front face electrode 12. In this embodiment, substrate 11 must therefore be transparent, and typically comprises a sheet of glass, although suitable transparent plastic materials may also be used. Glass is preferred because of its strength, desired optical properties and environmental stability. It is well known that photovoltaic structures in which light is incident from the side opposite the substrate may be manufactured, in which case substrate 11 need not be transparent. For a single cell device, substrate 11 would not necessarily need to be an electrical insulator as is generally required in module applications where the devices are generally formed into a number of series connected cells.

As described in U.S. Pat. No. 4,623,601, zinc oxide layers 12 and 17 may be deposited by a sputtering process. However, in the preferred embodiment, both layers 12 and 17 are zinc oxide deposited by the chemical vapor deposition process described in U.S. Pat. No. 4,751,149. More particularly, the zinc oxide in the preferred embodiment and the samples discussed below was deposited by use of diethyl zinc, $(C_2H_5)_2Zn$, diborane, $B_2H_6$, and water vapor in an inert carrier gas. As described in that patent, highly transparent, highly conductive films of boron doped zinc oxide may be grown at low temperatures using these materials.

Before deposition of any part of the TFS structure 13, the zinc oxide film 12 is treated by glow discharge including oxygen. As shown by the examples given below, this oxygen glow treatment has been found to improve the efficiency of TFS solar cells deposited upon a zinc oxide film which has been so treated. Investigations have suggested several possible reasons for this improved performance. In some cases, seeds or crystals of pure zinc appear to be the formed on the surface of film 12 during the zinc oxide deposition process. The oxygen glow discharge process oxidizes this elemental zinc to form zinc oxide. The as deposited zinc oxide film may end up with alternate zinc and oxygen atoms on its surface. While TFS forms strong bonds to the oxygen atoms, the zinc atoms cannot make good covalent bonds to silicon, leaving dangling bonds or ionic bonds at the interface. The existence of interface states can act as carrier recombination centers to degrade cell performance. However, after oxygen glow treatment, the surface of a zinc oxide film should be covered with only oxygen atoms. Upon deposition of TFS, all silicon atoms should therefore bond directly to oxygen avoiding the weak silicon to zinc bonds. The oxygen glow treatment also removes contaminants from the zinc oxide film surface to allow a better contact to the silicon film. In any case, the oxygen glow treatment provides a significant improvement in performance of TFS photoconductive devices fabricated on zinc oxide coated substrates.

After the oxygen glow treatment, the TFS structure 13 is deposited onto the zinc oxide film 12. Preferably, TFS is deposited in the same glow discharge vacuum system used to treat the zinc oxide film 12 with the oxygen glow. Preferably, vacuum is not broken after the oxygen glow treatment so there is no chance of exposing the surface of film 12 to any atmospheric contaminants. The TFS layers 14, 15 and 16 are deposited by glow discharge in silane and appropriate diluents and doping gases as is well known in the art. The above referenced Pat. 4,623,601 provides specific deposition parameters by way of example.

Back conductor 17 is preferably zinc oxide and may be deposited by sputtering or the chemical vapor deposition process as discussed above. Alternatively, back contact 17 may be a conductive metal such as aluminum which may be deposited by evaporation, sputtering or other known methods.

The present invention was tested by fabricating TFS cells on glass substrates having dimensions of ten by ten centimeters. A zinc oxide film having a thickness of 1.8 microns and sheet rho about 7 ohms per square was deposited on these substrates by the chemical vapor deposition process described above. The substrates were placed in a vacuum chamber and pressure reduced to 50 millitorr. The substrate was heated to a temperature of 205 degrees centigrade. $O_2$ flow was established at 6 SCCM (standard cubic centimeters per minute) and then 30 watts of RF power at 13.56 MHz was supplied to generate a glow discharge between electrodes having dimensions of 40 by 40 centimeters. In this test, samples were treated for the following time periods: 0, 1.5, 3 and 6 minutes. All samples then had an identical PIN TFS photovoltaic structure deposited on the zinc oxide without breaking vacuum after the $O_2$ glow. The devices were completed by deposition of a zinc oxide back contact and were then tested for photovoltaic conversion efficiency at maximum power. Those which had been treated by $O_2$ glow for 1.5 minutes, had efficiencies of from 8.71% to 8.73%. Some samples treated by $O_2$ glow for three and six minutes had slightly higher efficiencies. Those treated for 0 minutes, that is those which did not receive an $O_2$ glow treatment, had efficiencies of from 8.03% to 8.27%. These results indicated that the optimum $O_2$ glow treatment time is probably less than 1.5 minutes. That is, it appears that substantially all of the performance improvement is achieved within the first 1.5 minutes of $O_2$ glow treatment and the minimum processing time is preferred to minimize fabrication cost.

As used herein the term "oxygen glow treatment" refers to a radio frequency driven glow discharge in an atmosphere containing oxygen at low pressure. In the examples only oxygen was used. However, mixtures of oxygen and inert gases, such as argon or helium, should also work and would be safer to handle than pure oxygen. A mixture of oxygen and nitrogen, possibly even clean air, should also provide the necessary source of oxygen. In early testing of the invention, filtered room air was used with positive results. Other methods of driving the glow discharge, e.g., D.C., should also be useful.

While the present invention has been illustrated and described with reference to particular methods for making certain photovoltaic structures, it will be appreciated that various modifications can be made therein within the scope of the present invention as defined by the appended claims.

What we claim is:

1. In a process for production of a photoconductive device wherein a first conductive layer comprising ZnO is applied to a substrate, and a thin film silicon hydrogen alloy is applied to said first conductive layer, the improvement comprising:
    after applying said first conductive layer comprising ZnO to said substrate, treating said first conductive layer with a glow discharge in a gas containing a source of oxygen.

2. The improved process of claim further including, after treating of said first conductive layer with a glow discharge in a gas containing source of oxygen, and without breaking vacuum, applying said thin film silicon hydrogen alloy by glow discharge in silane.

3. The improved process of claim 1 wherein said gas comprises oxygen.

4. The improved process of claim 1 wherein said gas comprises a mixture of oxygen and an inert gas.

5. The improved process of claim 4 wherein said inert gas includes one or more of argon, helium or nitrogen.

6. The improved process of claim 1 wherein said gas comprises air.

7. A process for making a photovoltaic device comprising:
    depositing a film of zinc oxide onto a substrate to form a first current collecting contact,
    treating said zinc oxide film with a glow discharge in a gas containing a source of oxygen,
    depositing on said zinc oxide film at least one film of silicon containing one or more of hydrogen and a conductivity modifying dopant, to form a photovoltaic structure, and
    depositing on said photovoltaic structure a conductive film to form a second current collecting contact.

8. The process of claim 7 wherein said gas comprises oxygen.

9. The process of claim 7 wherein said gas comprises a mixture of oxygen and an inert gas.

10. The process of claim 9 wherein said insert gas includes one or more of argon, helium or nitrogen.

11. The process of claim 7 wherein said zinc oxide film is deposited by chemical vapor deposition from diethyl zinc, diborane and water vapor in an inert carrier gas.

12. The process of claim 7 wherein said second current collecting film comprises a conductive zinc oxide film.

13. The process of claim 7 wherein said gas comprises air.

* * * * *